(12) United States Patent
Chu et al.

(10) Patent No.: US 11,049,534 B2
(45) Date of Patent: Jun. 29, 2021

(54) COLUMN CONTROL CIRCUIT AND SEMICONDUCTOR DEVICE INCLUDING THE SAME

(71) Applicant: SK hynix Inc., Icheon-si (KR)

(72) Inventors: Kyung Ho Chu, Icheon-si (KR); Soo Bin Lim, Suwon-si (KR); Yong Suk Joo, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/809,266

(22) Filed: Mar. 4, 2020

(65) Prior Publication Data

US 2021/0074339 A1 Mar. 11, 2021

(30) Foreign Application Priority Data

Sep. 5, 2019 (KR) .................. 10-2019-0109925

(51) Int. Cl.
| | | |
|---|---|---|
| *G11C 8/18* | (2006.01) | |
| *G11C 7/12* | (2006.01) | |
| *G11C 7/08* | (2006.01) | |
| *G11C 7/10* | (2006.01) | |
| *G11C 7/22* | (2006.01) | |

(52) U.S. Cl.
CPC .................. *G11C 7/12* (2013.01); *G11C 7/08* (2013.01); *G11C 7/106* (2013.01); *G11C 7/1063* (2013.01); *G11C 7/222* (2013.01)

(58) Field of Classification Search
CPC .. G11C 7/12; G11C 7/08; G11C 7/106; G11C 7/1063; G11C 7/222

USPC ........................................................ 365/193
See application file for complete search history.

(56) References Cited

U.S. PATENT DOCUMENTS

| | | | | |
|---|---|---|---|---|
| 9,564,195 B2* | 2/2017 | Ji | .......................... | G11C 7/1069 |
| 2010/0302873 A1 | 12/2010 | Lee | | |
| 2016/0163368 A1* | 6/2016 | Ji | .......................... | G11C 7/1069 365/189.05 |

FOREIGN PATENT DOCUMENTS

KR 100753400 B1 8/2007

* cited by examiner

*Primary Examiner* — Xiaochun L Chen
(74) *Attorney, Agent, or Firm* — William Park & Associates Ltd.

(57) ABSTRACT

A column control circuit may include a column control signal generation circuit and a column access block signal generation circuit. The column control signal generation circuit is configured to activate an input/output strobe signal when a column access block signal is deactivated. The column control signal generation circuit is configured to deactivate the input/output strobe signal when the column access block signal is activated. The column access block signal generation circuit is configured to activate the column access block signal when gap-less read commands may be inputted. The column access block signal generation circuit may deactivate the column access block signal during a period corresponding to an N-th read command among the gap-less read commands. N is an integer that is no less than 2.

17 Claims, 6 Drawing Sheets

COLUMN CONTROL CIRCUIT AND SEMICONDUCTOR DEVICE INCLUDING THE SAME

CROSS-REFERENCE TO RELATED APPLICATION

The present application claims priority under 35 U.S.C. § 119(a) to Korean application number 10-2019-0109925, filed on Sep. 5, 2019, in the Korean Intellectual Property Office, which is incorporated herein by reference in its entirety.

BACKGROUND

1. Technical Field

Various embodiments may generally relate to a semiconductor circuit, more particularly, a column control circuit and a semiconductor device including the column control circuit.

2. Related Art

A semiconductor circuit, for example, a graphic memory, may aid a continuous read operation with respect to a same address (hereinafter, referred to as a gap-less read operation) so as to improve the performance of the graphic memory.

A tCCD (column to column delay) 2CLK of a gap-less read operation may be aided. That is, a continuous read operation having the 2CLK interval with respect to the same address may be aided.

However, the continuous read operation with respect to the same address may have insufficient time for developing and charge sharing. Thus, data levels of a bit line and a bit bar line may be changed.

SUMMARY

In example embodiments of the present disclosure, a column control circuit may include a column control signal generation circuit, and a column access block signal generation circuit. The column control signal generation circuit may be configured to activate an input/output strobe signal when a column access block signal may be deactivated. The column control signal generation circuit may be configured to deactivate the input/output strobe signal when the column access block signal may be activated. The column access block signal generation circuit may be configured to activate the column access block signal when gap-less read commands may be inputted. The column access block signal generation circuit may be configured to deactivate the column access block signal during a period corresponding to an N-th read command among the gap-less read commands. N is an integer that is no less than 2.

In example embodiments of the present disclosure, a semiconductor device may include a memory cell array region, a data bus sense amplifier and a column control circuit. The memory cell array region may be configured to output data based on a column selection signal. The data bus sense amplifier may be configured to transmit the data outputted from the memory cell array region to a global data line based on an input/output strobe signal. The column control circuit may deactivate the input/output strobe signal when the gap-less read commands may be inputted. The column control circuit may activate the input/output strobe signal during a period corresponding to an N-th read command among the gap-less read commands, wherein N is an integer that is no less than 2.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

In the following description of the embodiments, it will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Example embodiments provide a column control circuit that may be capable of performing a stable and reliable gap-less read operation.

Example embodiments also provide a semiconductor device including the above-mentioned column control circuit.

Figure 1:
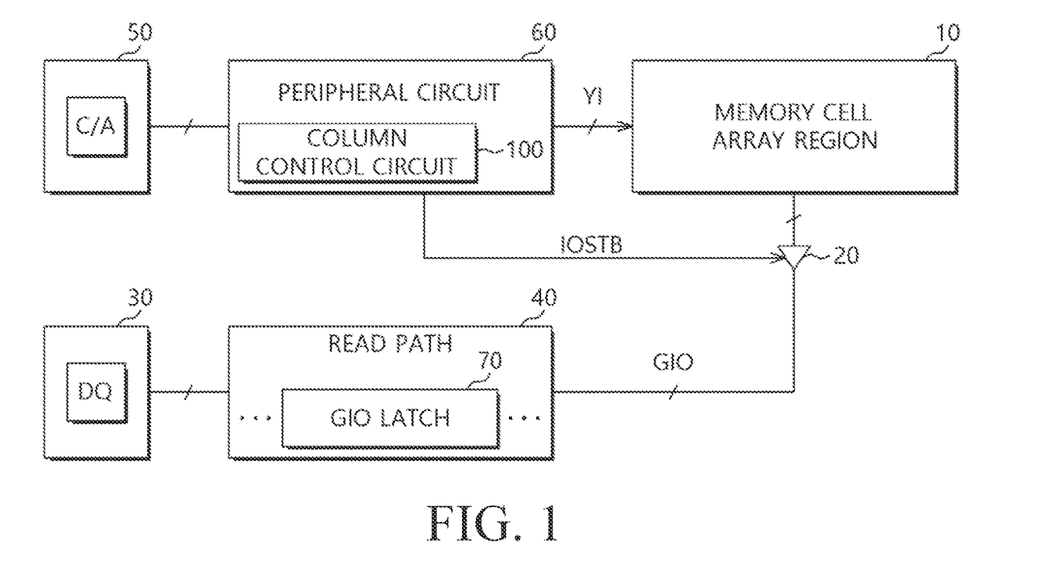
FIG. 1 is a view illustrating a semiconductor device based on example embodiments.

FIG. 1 is a view illustrating a semiconductor device based on example embodiments.

Referring to FIG. 1, a semiconductor device 1 may include a memory cell array region 10, a data bus sense amplifier 20, and a column control circuit 100.

The semiconductor device 1 may further include an input/output pad array 30, a read path 40, a command/address pad array 50, a peripheral circuit 60, and a global data line latch (hereinafter, referred to as GIO latch) 70.

A column path may be selectively connected to the memory cell array region 10 based on a column selection signal YI. The memory cell array region 10 may then output data based on a read command.

The memory cell array region 10 may include a plurality of memory cells, connected to word lines and a pair of bit lines including bit lines and bit bar lines, and a column switching circuit selectively connected to the memory cells based on the column selection signal YI.

The data bus sense amplifier 20 may transmit the data that is outputted from the memory cell array region 10 to the global data line GIO based on an input/output strobe signal IOSTB.

The column control circuit 10 may deactivate the column selection signal YI and the input/output strobe signal IOSTB when gap-less read commands are inputted, and the column control circuit 10 may activate the column selection signal YI and the input/output strobe signal IOSTB during a section corresponding to an N-th (the N may be an integer of no less than 2) read command among the gap-less read commands.

The gap-less read commands may correspond to an at least twice inputted read command based on the same address signal.

The input/output pad array 30 may include a plurality of DQ pads that are configured to input and output data.

The read path 40 may include circuits that are configured to process signals to output the data that is transmitted to the global data line GIO through the input/output pad array 30. The circuits may include a multiplexer, a pipe latch, etc.

The command/address pad array 50 may include a plurality of C/A pads that are configured to receive a command, an address, or a signal that is generated by integrating the command with the address.

The peripheral circuit 60 may include circuits, configured to process the command, and the address, inputted through the command/address pad array 50. The circuits may include a decoder, etc.

The column control circuit 100 may be included in the peripheral circuit 60. Alternatively, the column control circuit 100 may be included in other regions of the semiconductor device 1.

The GIO latch 70 may be configured to latch data levels of the global data line GIO.

The GIO latch 70 may be included in the read path 40. Alternatively, the GIO latch 70 may be included in other regions of the semiconductor device 1.

Figure 2:
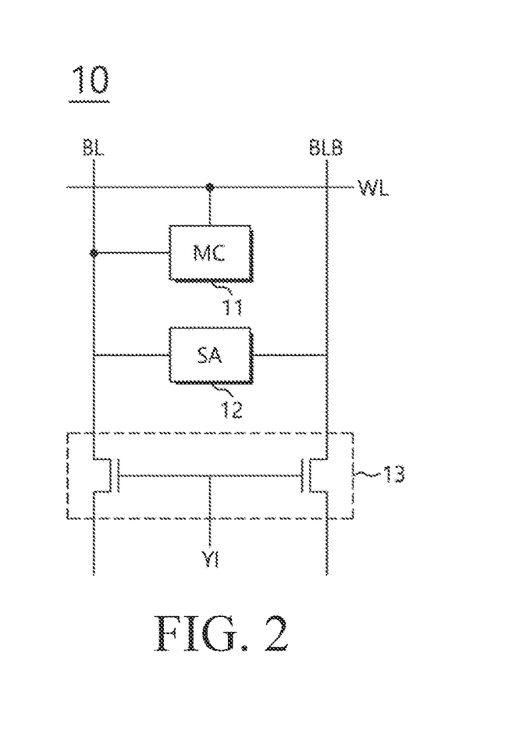
FIG. 2 is a view illustrating a memory cell array region in FIG. 1.

FIG. 2 is a view illustrating a memory cell array region in FIG. 1.

Referring to FIG. 2, a memory cell MC may be electrically coupled to a bit line BL and a word line WL. A pair of first data lines may include the bit line BL and a bit bar line BLB.

A sense amplifier 12 may be electrically coupled between the bit line BL and the bit bar line BLB.

A column switching circuit 13 may be electrically coupled between the pair of the bit lines BL and BLB and a pair of second data lines.

The column switching circuit 13 may be configured to transmit data, which may be sensed and amplified by the sense amplifier 12, to the second data lines when the column selection signal YI is activated, i.e., the column selection signal YI may be transited to a high level.

Figure 3:
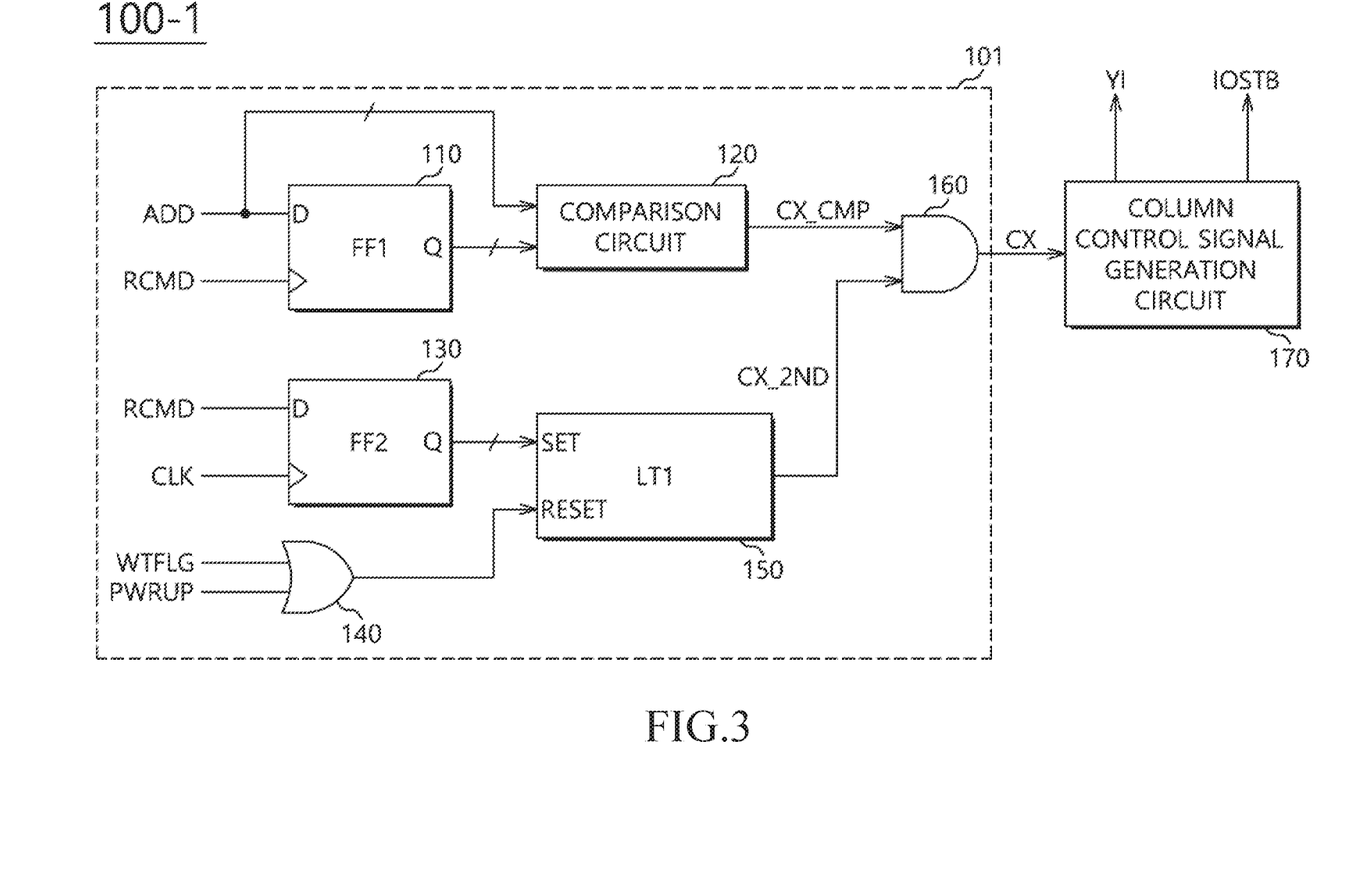
FIG. 3 is a view illustrating a column control circuit based on example embodiments.

FIG. 3 is a view illustrating a column control circuit based on example embodiments.

Referring to FIG. 3, a column control circuit 100-1, an example embodiment of the column control circuit 100 of FIG. 1, may include a column access block signal generation circuit 101 and a column control signal generation circuit 170.

The column access block signal generation circuit 101 may be configured to activate a column access block signal CX when the gap-less read command is inputted.

The column control signal generation circuit 170 may activate the column selection signal YI and the input/output strobe signal ISOTB when the column access block signal CX is deactivated. In contrast, the column control signal generation circuit 170 may deactivate the column selection signal YI and the input/output strobe signal ISOTB when the column access block signal CX is activated.

The column access block signal generation circuit 101 may include a first flip-flop (FF1) 110, a comparison circuit 120, a second flip-flop (FF2) 130, a first logic gate 140, a latch (LT1) 150, and a second logic gate 160.

The first flip-flop 110 may be configured to latch and output an address signal ADD based on an external read command RCMD.

The comparison circuit 120 may compare the address signal ADD with an output signal from the first flip-flop 110 to generate a comparison signal CX_CMP.

When the address signal ADD, based on a previous external read command RCMD, is substantially the same as the address signal ADD based on a current external read command RCMD, the comparison circuit 120 may output the comparison signal CX_CMP having a high level.

The second flip-flop 130 may be configured to latch and output the external read command RCMD based on a clock signal CLK.

The first logic gate 140 may be an OR logic gate for performing OR operation. The first logic gate 140 may perform an OR operation based on a write flag signal WTFLAG and a power-up signal PWRUP.

The latch 150 may set a continuous read recognition signal CX_2ND to a high level based on an output signal from the second flip-flop 130. The latch 150 may reset the continuous read recognition signal CX_2ND to a low level based on an output signal from the second flip-flop 130.

The second logic gate 160 may be a logic gate for performing an AND operation. The second logic gate 160 may perform an AND operation, based on the comparison signal CX_CMP and the continuous read recognition signal CX_2ND, to output a column access block signal CX.

When the comparison signal CX_CMP and the continuous read recognition signal CX_2ND are a high level, the second logic gate 160 may activate the column access block signal CX to a high level.

When the comparison signal CX_CMP is a high level, the previous address signal ADD may coincide with the current address signal ADD. When the continuous read recognition signal CX_2ND is a high level, the external read command may be continuously inputted at least two times. That is, the comparison signal CX_CMP and the continuous read recognition signal CX_2ND, having the high level, may be recognized as the gap-less read commands.

Figure 4:
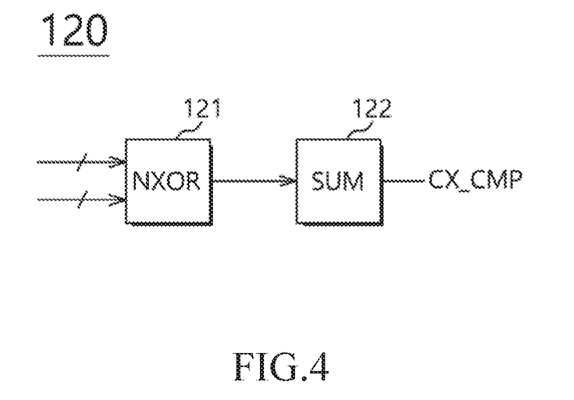
FIG. 4 is a view illustrating a comparison circuit in FIG. 3.

FIG. 4 is a view illustrating a comparison circuit in FIG. 3.

Referring to FIG. 4, the comparison circuit 120 may include an exclusive NOR gate NXOR 121 and a sum logic circuit SUM 122.

The exclusive NOR gate 121 may compare the previous address signal ADD with the current address signal ADD. When address bits of the previous address signal ADD are the same as the address bits of the current address signal ADD, the exclusive NOR gate 121 may output a high level of the signal.

The sum logic circuit 122 may add an output signal of the exclusive NOR gate 121 and output the comparison signal CX_CMP.

Figure 5:
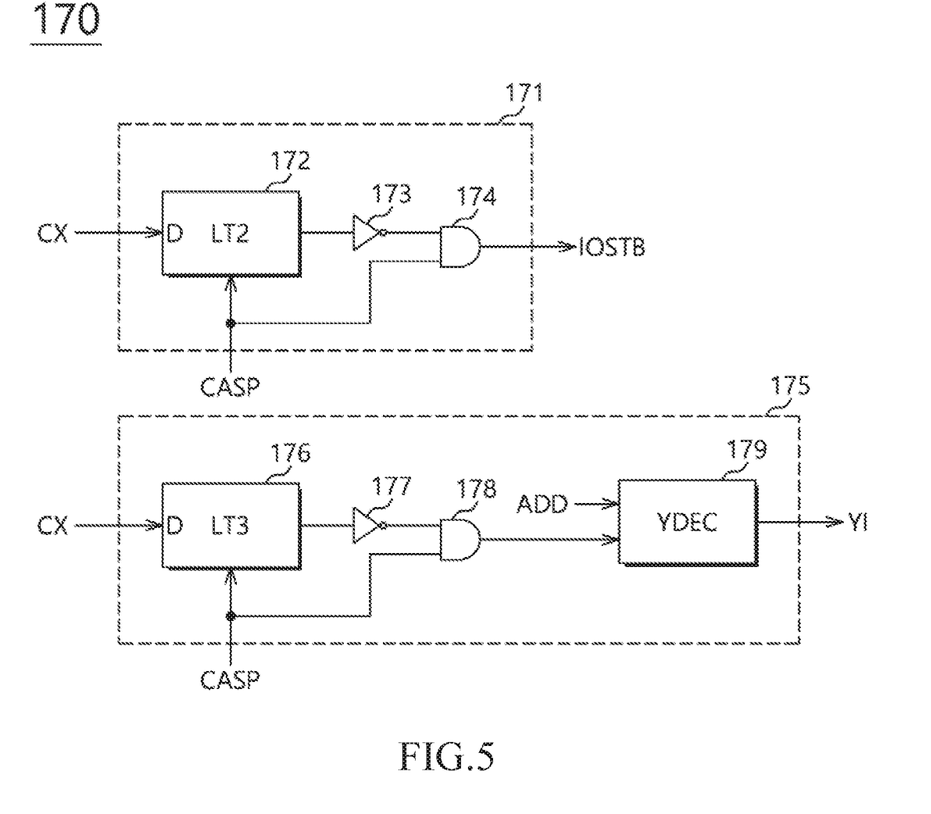
FIG. 5 is a view illustrating a column control signal generation circuit in FIG. 3.

FIG. 5 is a view illustrating a column control signal generation circuit in FIG. 3.

Referring to FIG. 5, the column control signal generation circuit 170 may include an input/output strobe signal generation circuit 171 and a column selection signal generation circuit 175.

The input/output strobe signal generation circuit 171 may include a latch (LT2) 172, an inverter 173, and a logic gate 174.

The latch 172 may latch the column access block signal CX in response to a column access strobe signal CASP.

The column access strobe signal CASP may be generated based on the external read command RCMD.

The inverter 173 may invert an output signal from the latch 171.

The logic gate 174 may be configured to perform an AND operation. For example, the logic gate 174 may include an AND logic gate. The logic gate 174 may perform an AND operation based on an output signal from the inverter 173 and the column access strobe signal CASP. The logic gate 174 may output the input/output strobe signal IOSTB.

When the column access block signal CX is activated to a high level, the input/output strobe signal generation circuit 171 may deactivate the input/output strobe signal IOSTB to a low level.

When the column access block signal CX is deactivated to a low level, the input/output strobe signal generation circuit 171 may activate the input/output strobe signal IOSTB to a high level based on the column access strobe signal CASP.

The column selection signal generation circuit 175 may include a latch (LT3) 176, an inverter 177, a logic gate 178, and a decoder (YDEC) 179.

The latch 176 may latch the column access block signal CX based on the column access strobe signal CASP.

The inverter 177 may invert an output signal from the latch 176.

The logic gate 178 may be configured to perform an AND operation. For example, the logic gate 178 may include an AND logic gate. The logic gate 178 may perform an AND operation based on an output signal from the inverter 177 and the column access strobe signal CASP.

The decoder 179 may decode the address signal ADD in response to the output signal from the logic gate 178. The decoder 179 may output the decoding resultant as the column selection signal YI.

When the column access block signal CX is activated to a high level, the column selection signal generation circuit 175 may deactivate the column selection signal YI to a low level regardless of the address signal ADD.

In contrast, when the column access block signal CX is deactivated to a low level, the column selection signal generation circuit 175 may activate the column selection signal YI corresponding to the address signal ADD being at a high level based on the column access strobe signal CASP.

Figure 6:
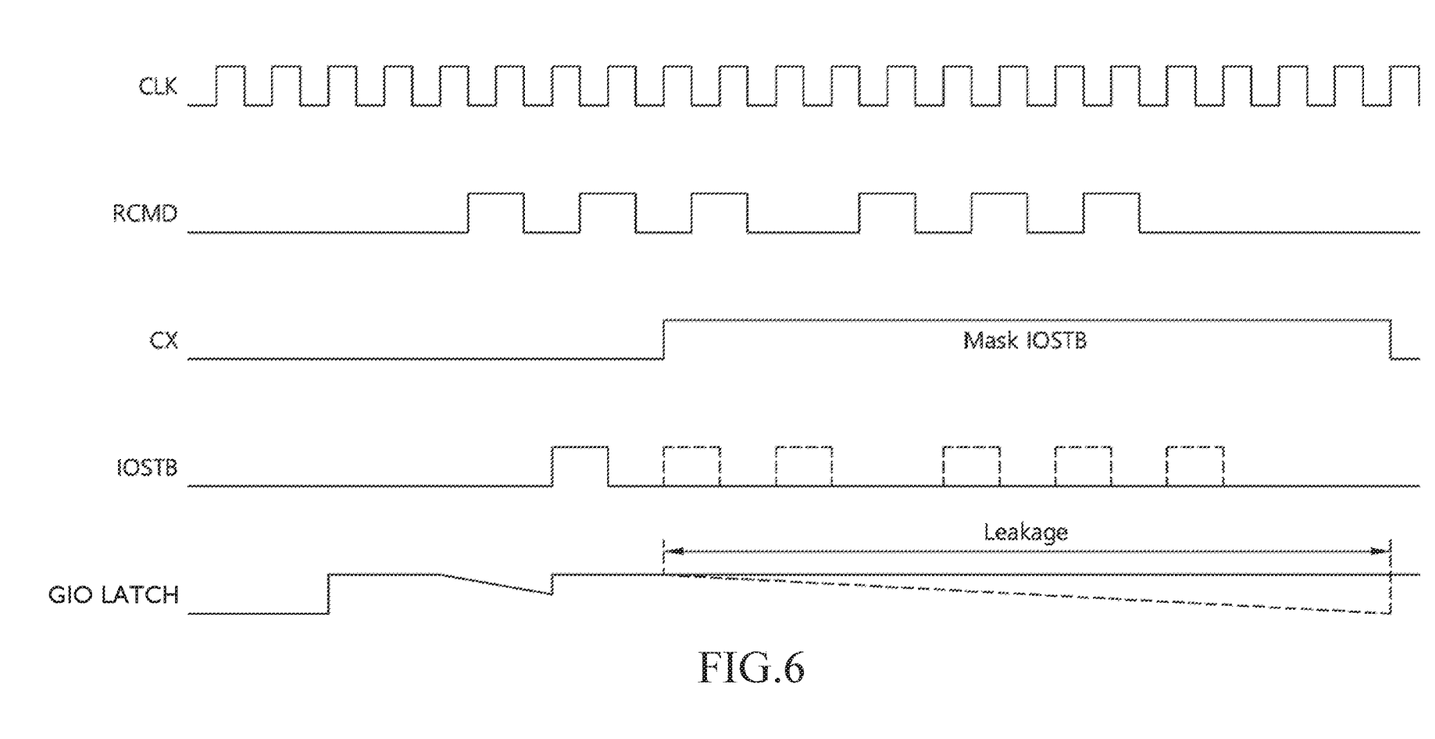
FIG. 6 is a timing diagram illustrating an operation of a column access based on example embodiments.

FIG. 6 is a timing diagram illustrating an operation of a column access based on example embodiments.

Referring to FIG. 6, when the column access block signal CX is deactivated to a low level, the input/output strobe signal IOSTB may be normally generated based on a first external read command RCMD.

When the gap-less read command is inputted (i.e., the address signal ADD, corresponding to a second external read command RCMD may coincide with the address signal ADD corresponding to the first external read command RMCD), the column access block signal CX may be activated to a high level.

The input/output strobe signals IOSTB, corresponding to the external read commands RCMD inputted after activating the column access block signal CX to the high level, might not be generated.

The gap-less read command may be the read command with respect to the same address. Thus, according to example embodiments, the data, latched by the GIO latch 70 in place of the data read from the memory cell, may be outputted from the semiconductor device 1 through the input/output pad array 30.

In example embodiments, when the gap-less read command is recognized, the column access, with respect to the memory cell array, may be blocked. The data, latched by the GIO latch 70 in place of the data read from the memory cell, may be outputted. Therefore, the data level changes of the bit line and the bit bar line, based on the gap-less read operation, might not be generated.

Here, an unintended current leakage may be generated based on a physical defect of the adjacent line among the global data lines GIO. For example, the current leakage may be generated by a micro bridge between the adjacent GIOs.

When the data bus sense amplifier 20 drives the global data line GIO based on the normally generated input/output strobe signals IOSTB, the global data line GIO may be refreshed.

However, when the generations of the input/output strobe signals IOSTB are blocked in the gap-less read operation, the amount of current leakage through the GIO may be above a driving force of the GIO latch 70, resulting in a read operation fail.

Figure 7:
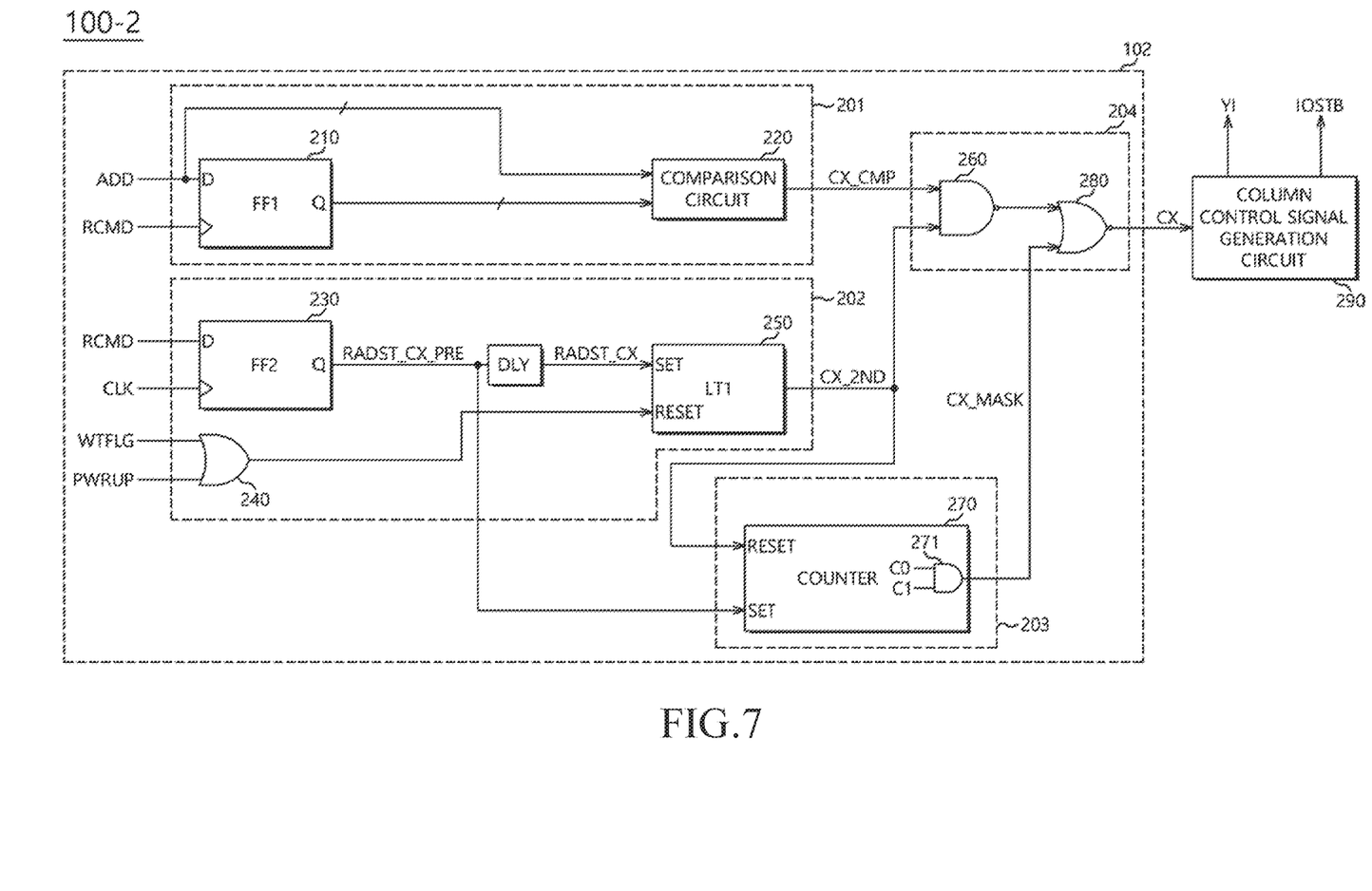
FIG. 7 is a view illustrating a column control circuit based on example embodiments.

FIG. 7 is a view illustrating a column control circuit based on example embodiments.

In this example embodiment, the generations of the input/output strobe signals IOSTB may be blocked in the gap-less read operation. Further, a part of the input/output strobe signal IOSTB may be normally generated to prevent the read operation fail caused by the current leakage of the GIO.

Referring to FIG. 7, a column control circuit 100-2, an example embodiment of the column control circuit 100 of FIG. 1, may include a column access block signal generation circuit 102 and a column control signal generation circuit 290.

The column access block signal generation circuit 102 may be configured to activate the column access block signal CX when the gap-less read command is inputted. Further, the column access block signal generation circuit 102 may deactivate the column access block signal CX during the section corresponding to the N-th read command among the gap-less read commands.

The column control signal generation circuit 290 may activate the column selection signal YI and the input/output strobe signal ISOTB when the column access block signal CX is deactivated. In contrast, the column control signal generation circuit 290 may deactivate the column selection signal YI and the input/output strobe signal ISOTB when the column access block signal CX is activated.

In example embodiments, the column control signal generation circuit 290 may have a configuration substantially the same as that of the column control signal generation circuit 170 in FIG. 3.

The column access block signal generation circuit 102 may include an address comparison circuit 201, a continuous read recognition circuit 202, a mask signal generation circuit 203, and a signal combination circuit 204.

The address comparison circuit 201 may compare the address signal ADD, based on the previous external read command RCMD, with the address signal ADD, based on the current external read command RCMD, to generate the comparison signal CX_CMP.

The continuous read recognition circuit 202 may latch the external read command RCMD based on the clock signal CLK to generate an internal read command RADST_CX_PRE. The continuous read recognition circuit 202 may generate a continuous read recognition signal CX_2ND based on the internal read command RA_DST_CX_PRE.

The mask signal generation circuit 203 may count the internal read command RADST_CX_PRE to generate a count signals C<1:0>. The mask signal generation circuit 203 may combine the count signals C<1:0> to generate a mask signal CX_MASK.

The signal combination circuit 204 may combine the comparison signal CX_CMP, the continuous read recognition signal CX_2ND and the mask signal CX_MASK to generate the column access block signal CX.

The signal combination circuit 204 may include a first logic gate 260 and a second logic gate 280.

The address comparison circuit 201 may include a first flip-flop 210 and a comparison circuit 220.

The continuous read recognition circuit 202 may include a second flip-flop 230, a delay DLY, and a latch 250.

The continuous read recognition circuit 202 may further include a third logic gate 240.

The mask signal generation circuit 203 may include a counter 270.

The first flip-flop 210 may latch the address signal ADD based on the external read command RCMD.

The comparison circuit 220 may compare the address signal ADD with an output signal from the first flip-flop 210 to generate the comparison signal CX_CMP.

When the address signal ADD, based on a previous external read command RCMD, is substantially the same as the address signal ADD based on a current external read command RCMD, the comparison circuit 220 may output the comparison signal CX_CMP having a high level.

The comparison circuit 230 may have a configuration substantially the same as that of the comparison circuit 130 in FIG. 3.

The second flip-flop 230 may be configured to latch the external read command RCMD based on the clock signal CLK to generate the internal read command RADST_CX_PRE.

The delay DLY may delay the internal read command RADST_CX_PRE to generate a delayed internal read command RA_DST_CX.

The latch 250 may set the continuous read recognition signal CX_2ND to a high level based on the delayed internal read command RADST_CX.

The first logic gate 260 may be configured to perform an NAND operation. For example, the first logic gate 260 may include a NAND logic gate. The first logic gate 260 may perform a NAND operation based on the comparison signal CX_CMP and the continuous read recognition signal CX_2ND.

When the comparison signal CX_CMP is a high level, the previous address signal ADD may be the same as the current address signal ADD. When the continuous read recognition signal CX_2ND is a high level, the external read command may be continuously inputted at least two times. That is, the output signal from the first logic gate 260, having a low level, may be recognized as the gap-less read commands.

The counter 270 may count the internal read command RADST_CX_PRE to generate the count signals C<1:0>. The counter 270 may include an AND logic gate 271 to perform an AND operation based on C1 bit and C0 bit of the count signals C<1:0>.

When the internal read command RADST_CX_PRE is inputted N times (N may be 3), the counter 270 may activate the mask signal CX_MASK to a high level.

In example embodiments, the generation of the input/output strobe signals IOSTB, corresponding to the gap-less read command, may be blocked. Further, in order to normally generate the input/output strobe signal IOSTB, corresponding to the third read command, the counter 270 may include the two bits of counter. Alternatively, the counter 270 may have other configurations based on the number N.

The counter 270 may reset a value of the count signals C<1:0> based on the low level of the continuous read recognition signal CX_2ND.

The second logic gate 280 may be configured to perform an NOR operation. For example, the second logic gate 280 may include a NOR Logic gate. The second logic gate 280 may perform a NOR operation based on an output signal from the first logic gate 260 and the mask signal CX_MASK. The second logic gate 280 may output the column access block signal CX.

The third logic gate 240 may be configured to perform an OR operation. For example, the third logic gate 240 may include an OR logic gate. The third logic gate 240 may perform an OR operation based on the write flag signal WTFLAG and the power-up signal PWRUP.

The continuous read recognition signal CX_2ND may be reset to a low level based on an output signal from the third logic gate 240.

Figure 8:
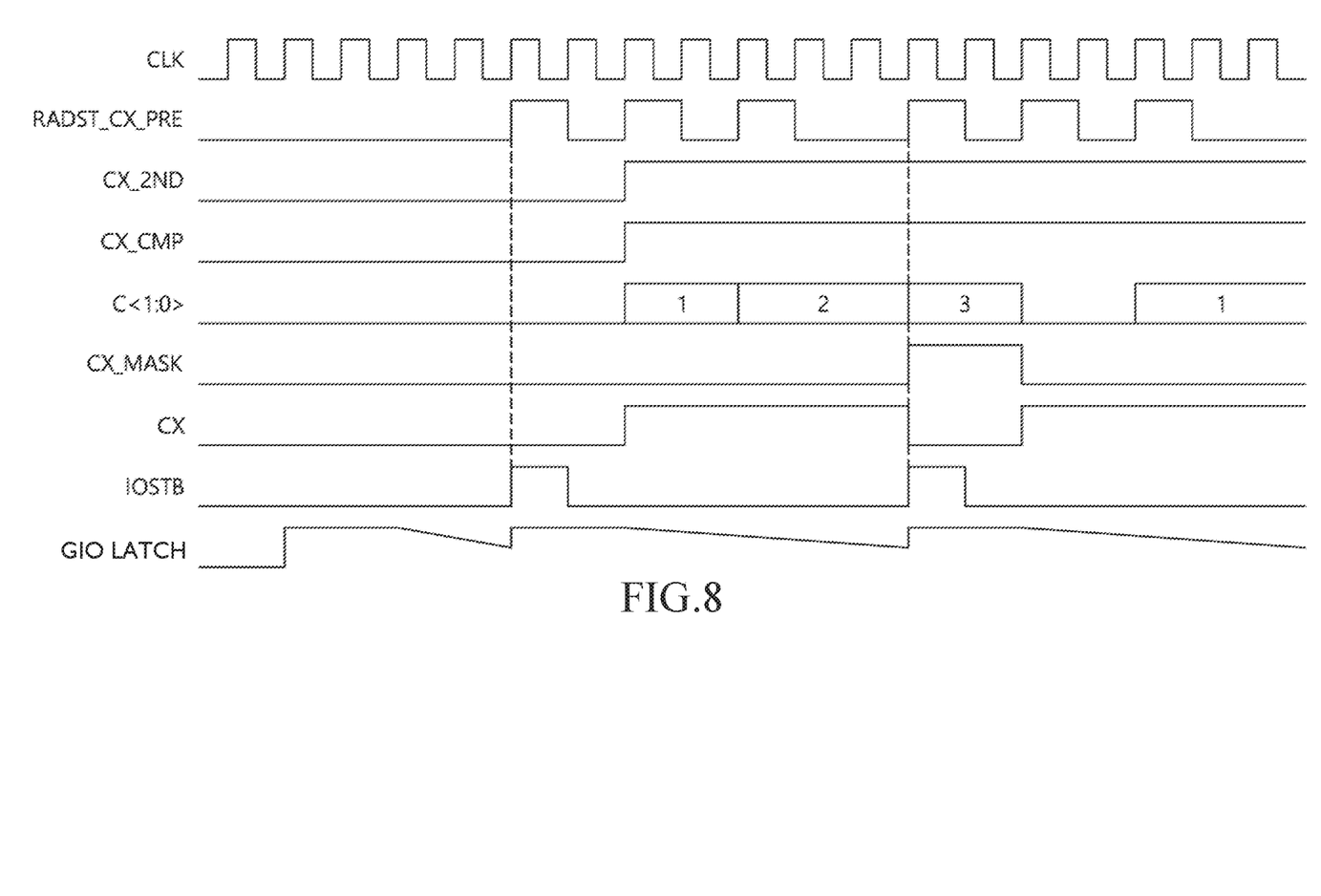
FIG. 8 is a timing diagram illustrating an operation of a column access based on example embodiments.

FIG. 8 is a timing diagram illustrating an operation of a column access based on example embodiments.

Referring to FIGS. 7 and 8, when the first internal read command RADST_CX_PRE is inputted, the column access block signal CX may be maintained at a low level since the continuous read recognition signal CX_2ND and the mask signal CX_MASK may be at a low level.

The input/output strobe signal IOSTB may be normally generated since the column access block signal may be at the low level.

Although not depicted in drawings, the column selection signal YI may also be generated at a set timing.

The global data line GIO may be driven in a corresponding data level by the operation of the data bus sense amplifier 20 based on the input/output strobe signal IOSTB. Thus, the output of the GIO latch 70 may also be refreshed.

When the second internal read command RADST_CX_PRE, based on the address signal ADD being substantially the same as the first internal read command RADST_CX_PRE, is inputted, the comparison signal CX_CMP and the continuous read recognition signal CX_2ND may be transited to a high level so that the output signal from the first logic gate 260 may be transited to a low level. A value of the count signals C<1:0> may be increased to '1' (decimal number).

The internal read commands RADST_CX_PRE after the second internal read command may be recognized as the gap-less read command. The second internal read command RADST_CX_PRE may correspond to the first read command among the gap-less read commands.

Because the '1' of the count signals C<1:0> may be the decimal number, the mask signal CX_MASK may be maintained at a low level.

Because the output signal from the first logic gate 260 and the mask signal CX_MASK may be at the low level, the column access block signal CX may be transited to a high level.

Because the column access block signal CX may be the high level, the generation of the input/output strobe signal IOSTB corresponding to the second internal read command RADST_CX_PRE may be blocked.

Although not depicted in drawings, the generation of the column selection signal YI may also be blocked.

When a third internal read command RADST_CX_PRE, based on the address signal ADD being substantially the same as the first internal read command RADST_CX_PRE, is inputted, the generation of the corresponding input/output strobe signal IOSTB may also be blocked because the column access block signal CX may be a high level. At that time, the third internal read command RADST_CX_PRE may correspond to the second command of the gap-less read commands.

When a fourth internal read command RADST_CX_PRE, based on the address signal ADD being substantially the same as the first internal read command RADST_CX_PRE, is inputted, the output signal from the first logic gate 260 may be maintained as the low level. In contrast, the mask signal CX_MASK may be transited to a high level because the value of the count signals C<1:0> may be increased to '3' (decimal number). At that time, a fourth internal read command RADST_CX_PRE may correspond to the third read command of the gap-less read commands.

Because the mask signal CX_MASK may be the high level, the column access block signal CX may be transited to a low level.

When the column access block signal CX is at the low level, the input/output strobe signal IOSTB, corresponding to the fourth internal read command RADST_CX_PRE, may be normally generated.

An output level of the GIO latch 70 may be decreased by blocking the generations of the second and third internal read commands RADST_CX_PRE.

However, the global data line GIO may be driven in a corresponding data level by the operation of the data bus sense amplifier 20 based on the input/output strobe signal IOSTB corresponding to the fourth internal read command RADST_CX_PRE. Thus, the output of the GIO latch 70 may also be refreshed.

When a fifth internal read command RADST_CX_PRE, based on the address signal ADD being substantially the same as the first internal read command RADST_CX_PRE, is inputted, the value of the count signals C<1:0> may be reset to '0' (decimal number) so that the mask signal CX_MASK may be transited to a low level.

Because the mask signal CX_MASK may be at the low level, the column access block signal CX may be transited to a high level.

Because the column access block signal CX may be at the high level, the generation of the input/output strobe signal IOSTB, corresponding to the fifth internal read command RADST_CX_PRE, may be blocked.

In example embodiments, the input/output strobe signal IOSTB and the column selection signal YI may be normally generated based on the N-th read command among the gap-less read commands. In contrast, the generations of the input/output strobe signal IOSTB and the column selection signal YI may be blocked based on the rest of the gap-less read commands.

Therefore, the data, latched by the GIO latch 70 in place of the data read from the memory cell, may be outputted so that the data level changes of the bit line and the bit bar line, based on the gap-less read operation, might not be generated. Further, when the generations of the input/output strobe signals IOSTB are blocked in the gap-less read operation, the read operation fail, caused by exceeding the amount of current leakage through the GIO above a driving force of the GIO latch 70, might also not be generated. As a result, a stable and reliable gap-less read operation may be performed.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A column control circuit comprising:
    a column control signal generation circuit configured to activate an input/output strobe signal when a column access block signal is deactivated and configured to deactivate the input/output strobe signal when the column access block signal is activated; and
    a column access block signal generation circuit configured to deactivate the column access block signal during a period corresponding to every N-th read command among gap-less read commands and configured to activate the column access block signal during another periods besides the period corresponding to the N-th read command,
    wherein N is an integer that is no less than 2.

2. The column control circuit of claim 1, wherein the gap-less read commands correspond to read commands that are continuously inputted at least two times based on a same address signal.

3. The column control circuit of claim 1, wherein the column control signal generation circuit comprises:
   an input/output strobe signal generation circuit configured to generate the input/output strobe signal based on a column access strobe signal and the column access block signal; and
   a column selection signal generation circuit configured to generate a column selection signal based on the column access strobe signal, the column access block signal, and an address signal.

4. The column control circuit of claim 1, wherein the column access block signal generation circuit comprises:
   an address comparison circuit configured to compare a previous address signal with a current address signal to generate a comparison signal;
   a continuous read recognition circuit configured to latch an external read command based on a clock signal to generate an internal read command, and to generate a continuous read recognition signal based on the internal read command;
   a mask signal generation circuit configured to count the internal read command to generate count signals, and to combine the count signals to generate a mask signal; and
   a signal combination circuit configured to combine the comparison signal, the continuous read recognition signal and the mask signal with each other to generate the column access block signal.

5. The column control circuit of claim 4, wherein the address comparison circuit comprises:
   a flip-flop configured to latch an address signal based on the external read command; and
   a comparison circuit configured to compare the address signal with an output signal from the flip-flop to generate the comparison signal.

6. The column control circuit of claim 4, wherein the continuous read recognition circuit comprises:
   a flip-flop configured to latch the external read command based on the clock signal to generate the internal read command;
   a delay configured to generate a delayed internal read command by delaying the internal read command; and
   a latch configured to set the continuous read recognition signal based on the delayed internal read command.

7. The column control circuit of claim 6, wherein the latch is configured to reset the continuous read recognition signal based on the delayed internal read command and an output of a result obtained by an OR operation of a write flag signal and a power-up signal.

8. The column control circuit of claim 4, wherein the mask signal generation circuit is configured to count the internal read command to generate the count signal and to output a result obtained by an AND operation of bits of the count signal as the mask signal.

9. A semiconductor device comprising:
   a memory cell array region configured to output data based on a column selection signal;
   a data bus sense amplifier configured to transmit the data outputted from the memory cell array region to a global data line based on an input/output strobe signal;
   a global data line latch configured to latch data levels of the global data line and configured to refresh the data levels of the global data line according to an output of the data bus sense amplifier; and
   a column control circuit configured to deactivate the input/output strobe signal when gap-less read commands are inputted and to activate the input/output strobe signal during a period corresponding to an N-th read command among the gap-less read commands,
   wherein N is an integer that is no less than 2.

10. The semiconductor device of claim 9, wherein an output from the global data line latch is outputted from the semiconductor device when the gap-less read commands are inputted.

11. The semiconductor device of claim 9, wherein the column control circuit comprises:
   a column control signal generation circuit configured to activate the input/output strobe signal when a column access block signal is deactivated and configured to deactivate the input/output strobe signal when the column access block signal is activated; and
   a column access block signal generation circuit configured to activate the column access block signal when the gap-less read commands are inputted, and to deactivate the column access block signal during a period corresponding to an N-th read command among the gap-less read commands,
   wherein the gap-less read commands correspond to read commands that are continuously inputted at least two times based on a same address signal.

12. The semiconductor device of claim 11, wherein the column control signal generation circuit comprises:
   an input/output strobe signal generation circuit configured to generate the input/output strobe signal based on a column access strobe signal and the column access block signal; and
   a column selection signal generation circuit configured to generate a column selection signal based on the column access strobe signal, the column access block signal and an address signal.

13. The semiconductor device of claim 11, wherein the column access block signal generation circuit comprises:
   an address comparison circuit configured to compare a previous address signal with a current address signal to generate a comparison signal;
   a continuous read recognition circuit configured to latch an external read command based on a clock signal to generate an internal read command, and to generate a continuous read recognition signal based on the internal read command;
   a mask signal generation circuit configured to count the internal read command to generate count signals, and to combine the count signals to generate a mask signal; and
   a signal combination circuit configured to combine the comparison signal, the continuous read recognition signal and the mask signal with each other to generate the column access block signal.

14. The semiconductor device of claim 13, wherein the address comparison circuit comprises:
   a flip-flop configured to latch an address signal based on the external read command; and
   a comparison circuit configured to compare the address signal with an output signal from the flip-flop to generate the comparison signal.

15. The semiconductor device of claim 13, wherein the continuous read recognition circuit comprises:

a flip-flop configured to latch the external read command based on the clock signal to generate the internal read command;

a delay configured to delay the internal read command; and a latch configured to set the continuous read recognition signal based on the delayed internal read command.

16. The column control circuit of claim 15, wherein the latch is configured to reset the continuous read recognition signal based on the delayed internal read command and the output of a result obtained by an OR operation of a write flag signal and a power-up signal.

17. The semiconductor device of claim 13, wherein the mask signal generation circuit is configured to count the internal read command to generate the count signal and to output a result obtained by an AND operation of bits of the count signal as the mask signal.

* * * * *